United States Patent
Lin

(10) Patent No.: US 8,102,041 B2
(45) Date of Patent: Jan. 24, 2012

(54) INTEGRATED CIRCUIT PACKAGE

(75) Inventor: Tiang Hock Lin, Singapore (SG)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/767,873

(22) Filed: Apr. 27, 2010

(65) Prior Publication Data
US 2010/0207267 A1    Aug. 19, 2010

Related U.S. Application Data

(60) Division of application No. 11/280,869, filed on Nov. 16, 2005, now Pat. No. 7,727,799, which is a continuation of application No. PCT/SG03/00120, filed on May 20, 2003.

(51) Int. Cl.
*H01L 23/538* (2006.01)
*H01L 23/52* (2006.01)
*H01L 23/488* (2006.01)

(52) U.S. Cl. ........ 257/686; 257/680; 257/685; 257/704; 257/777; 257/778; 257/E23.01; 257/E23.023; 257/E23.141; 257/E23.169

(58) Field of Classification Search .............. 257/680, 257/685, 686, 704, 777, 778, E23.01, E23.023, 257/E23.141, E23.169
See application file for complete search history.

(56) References Cited

U.S. PATENT DOCUMENTS

| | | | |
|---|---|---|---|
| 5,495,394 A | 2/1996 | Kornfeld et al. | |
| 5,646,828 A | 7/1997 | Degani et al. | |
| 5,744,862 A | 4/1998 | Ishii | |
| 6,184,463 B1 | 2/2001 | Panchou et al. | |
| 6,294,406 B1 | 9/2001 | Bertin et al. | |
| 6,294,839 B1 | 9/2001 | Mess et al. | |
| 6,489,670 B1 | 12/2002 | Peterson et al. | |
| 6,555,917 B1 | 4/2003 | Heo | |
| 6,674,159 B1 | 1/2004 | Peterson et al. | |
| 6,774,467 B2 | 8/2004 | Horiuchi et al. | |
| 2002/0031864 A1 | 3/2002 | Ball | |
| 2002/0074652 A1 | 6/2002 | Pierce | |
| 2003/0034436 A1* | 2/2003 | Muramatsu et al. | 250/214.1 |

FOREIGN PATENT DOCUMENTS

| | | |
|---|---|---|
| EP | 0 729 183 A2 | 8/1996 |
| EP | 1 137 066 A2 | 9/2001 |
| JP | 2000-269409 | 9/2000 |

OTHER PUBLICATIONS

Quirk, M., et al., "Semiconductor Manufacturing Technology", 2001, p. 574, Prentice Hall.

* cited by examiner

*Primary Examiner* — Eugene Lee
*Assistant Examiner* — Peniel M Gumedzoe
(74) *Attorney, Agent, or Firm* — Slater & Matsil, L.L.P.

(57) ABSTRACT

Two integrated circuits having circuitry on one of their major surfaces are ground on their opposite major surfaces to reduce their thickness. The ground integrated circuits are then adhered together to form a composite body and placed in a chamber formed within a substrate such as a printed circuit board. Electrical connections are formed between contacts of the integrated circuits and contacts of the substrate. Components may be mounted on the outer surfaces of the substrate.

24 Claims, 3 Drawing Sheets

INTEGRATED CIRCUIT PACKAGE

This application is a divisional of patent application Ser. No. 11/280,869, entitled "An Integrated Circuit Package," filed on Nov. 16, 2005, now U.S. Pat. No. 7,727,799 which application is a continuation of International Application No. PCT/SG03/00120, filed May 20, 2003, which designated the United States and was published in English, both of which applications are incorporated herein by reference.

TECHNICAL FIELD

The present invention relates to methods of packaging integrated circuits, and to the packaged integrated circuits.

BACKGROUND

Packaging refers to the process of mounting integrated circuits (dies), which are principally composed of a semiconductor within a protective body, with electric contacts of the integrated circuit connected to conductive elements extending through the body, so that the conductive elements can electrically connect the integrated circuit to other electronic circuitry. Perhaps the most common conventional packaging technique is wire bonding, in which wire bonds are formed between electrical contacts (pads) on the integrated circuit and fingers of a lead frame. A resin body is then molded around the integrated circuit and wire bonds, and the lead frame is cut to leave portions of the lead fingers projecting out of resin body, for easy connection to a PCB (printed circuit board) or other substrate.

Many variations of this technique are known, such as variations in which the integrated circuit is mounted directly on the PCB, and the wire bonds are formed directly between the PCB and the integrated circuit. In other variations, multiple integrated circuits are stacked on one surface of the PCB. In yet further variations, integrated circuits are packaged on opposite surfaces of the PCB.

Another common packaging technique employs "flip-chips", that is, integrated circuits that have electric contacts on one of their major faces, and are adapted to be placed with that major surface directed downwardly onto a surface of the substrate, with the electric contacts of the flip-chips in register with corresponding electric contacts of the substrate. Special measures are taken to ensure that all the respective pairs of contacts meet, despite any unevenness that may exist in the surface of the integrated circuit or substrate. The space between the flip-chip and the substrate is then filled with an insulating "underfill" layer.

SUMMARY OF THE INVENTION

In general terms, the present invention proposes that two integrated circuits having circuitry on respective ones of their major surfaces are ground on their opposite major surface to reduce their thickness, and that the ground integrated circuits are placed back-to-back in a chamber formed within a substrate (such as a PCB). Electrical connections are formed between pads of the integrated circuits and contact points on the walls of the chamber. The contacts points of the substrate are electrically connected to wiring, e.g., for connecting the integrated circuit to other components mounted on the substrate.

Embodiments of the invention make it possible for integrated circuits to be packaged while occupying a very small amount (or even none) of the outer surface area of the substrate. Accordingly, aspects of the invention make it possible for an increased number of integrated circuits (or other components) to be connected to a substrate without increasing the surface of the substrate.

This may be achieved without increasing the thickness of the substrate, since the total ground thickness of the integrated circuits is preferably less than the thickness of the substrate.

Therefore, in contrast to conventional techniques (such as wire bonding and flip-chips) the present invention may lead to the following possible advantages:

1. The number of integrated circuits that can be provided for a given substrate surface area is increased.
2. The total thickness of the combination of the substrate and integrated circuit combination is reduced, in comparison to arrangements in which the integrated circuit rests on one exterior surface of the substrate.
3. Since no wire bonds are required, it is possible to connect the pads of the integrated circuits to other components by shorter electrical connection paths as compared to the wire bonding packaging technique. This leads to more robust signals, having less signal distortion at very high operating frequencies.
4. The technique does not leave a resin body exposed on either side of the substrate.
5. The substrate provides effective protection of the integrated circuits, to at least as high a degree as the resin body used in the known technique.
6. The assembly process is simplified, since there is no need for a wire bonding step, an underfill step, a molding step, etc.

The surface of each integrated circuit carrying the circuitry may be formed by conventional flip-chip technology. The wall of the chamber, which this surface of the integrated circuit faces, may include contact points in register with the electric contacts of the integrated circuit, and electrically connected to leads that extend through the substrate material, e.g., to an outer surface of the substrate. When the integrated circuit is inserted into the chamber, the respective contact points of the integrated circuit and wall may directly contact each other, or with a conducting material located between them. This connection may be formed by the flip-chip process conventionally known as "thermal compression" (in which force and temperature are simultaneously applied with an ACF (anisotropic conductive film) or ACP (anisotropic conductive paste) between the integrated circuit and corresponding contacts of the chamber) and/or the flip-chip process conventionally known as "solder reflowing" (such as IR solder reflowing).

The two integrated circuits may be adhered together at their ground down surfaces, for greater stability. This may be done to form a composite body, which is subsequently placed into the chamber. Alternatively, the integrated circuits may be placed consecutively into the chamber, and optionally adhered together there.

Preferably an electrically conductive layer is placed between the integrated circuits, extending over at least a part, and more preferably substantially all, of the interface between the integrated circuits. The conductive layer may for example be adhesive too, so that it performs both roles. This conductive layer may act as a common earth to which one or more of the electric contacts of either or both of the integrated circuits may be connected.

In some arrangements, the substrate may be formed as two or more substrate elements that are joined together sandwiching the integrated circuits.

One possibility is for each of two substrate elements to contain a cavity, and for the two substrate elements to be placed with the cavities facing each other to define the chamber. The cavities may be of the same size, or of different sizes, e.g., to receive respective integrated circuits of different respective sizes.

Another possibility is for the chamber to be formed as a cavity within a primary substrate element and for the cavity to be closed by one or more secondary substrate elements that are arranged to extend over an opening of the cavity. The second substrate elements may be thinner than the primary substrate elements and integrated circuits and may contain electric circuitry.

The integrated circuit package may further include, on one or both sides of the primary substrate element, (i) one or more additional integrated circuits (preferably integrated circuits ground down on their major surface opposite the circuitry, as discussed above) on the outer surfaces of the secondary substrate elements; and (ii) tertiary substrate elements over the additional integrated circuits. The electrical contacts on the additional integrated circuit(s) may face and be electrically connected to either of the secondary substrate elements or the tertiary substrate elements. Any space remaining between the secondary and tertiary substrate elements may be filed by resin material (e.g., injected as a liquid into the space and then cured), and/or by "spacer" elements, which are placed onto the secondary substrate elements before the tertiary substrate elements are located there.

Optionally, this combination of (i) additional integrated circuits and (ii) additional substrate elements, may repeated an arbitrary number of times on one or both sides of the primary substrate element.

In any case, further integrated circuits may be located on the outer surface(s) of the substrate. These further integrated circuits may be flip-chips with electrical contacts directed onto the outer surfaces of the substrate. Alternatively, any one or more of these further integrated circuits could be fixed to the outer surface(s) of the substrate by wire bonding.

BRIEF DESCRIPTION OF THE DRAWINGS

Preferred features of the invention will now be described, for the sake of illustration only, with reference to the following figures in which.

DETAILED DESCRIPTION OF ILLUSTRATIVE EMBODIMENTS

Figure 1A:
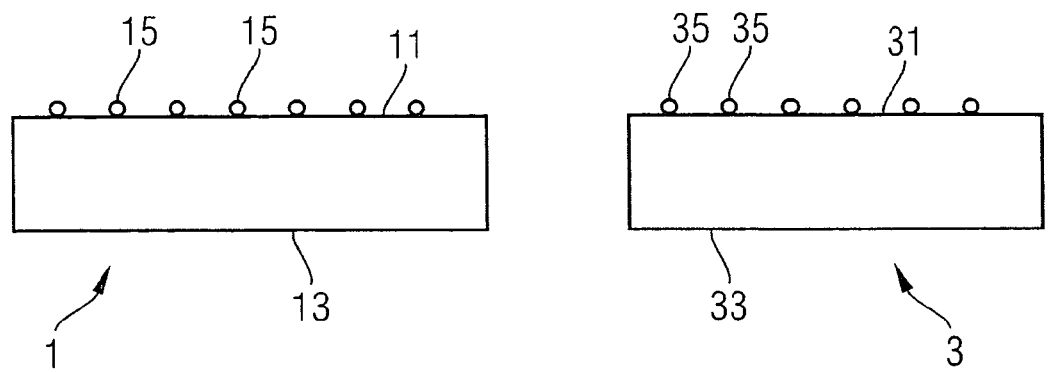
FIG. 1, which is composed of FIGS. 1a to 1c, shows steps that are part of a method which is an embodiment of the invention.

Referring firstly to FIG. 1a two integrated circuits 1, 3 for use in the embodiment are shown. These integrated circuits are similar to conventional flip-chips. They have major surfaces 11, 13, 31, 33. A first major surface 11, 31 of each flip-chip includes electrical components. As in conventional flip-chips, these major surfaces also include bumps 15 and 35 for making electrical contact with a substrate as explained below. These bumps may be made of solder, gold stud, gold plated or nickel plated polymer, copper pillars, etc.

Figure 1B:
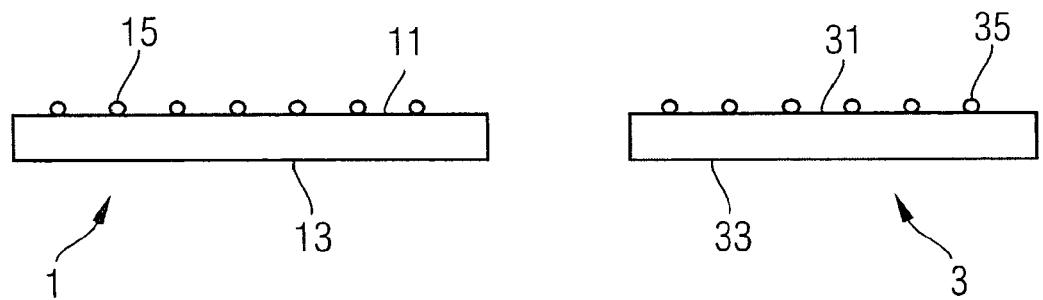

In a first step of the embodiment, the integrated circuits 1, 3 are ground down by a grinding operation performed to their surfaces 13, 33 to reduce the thickness of the integrated circuits. The thinner integrated circuits 1, 3 are shown in FIG. 1(b).

Figure 1C:
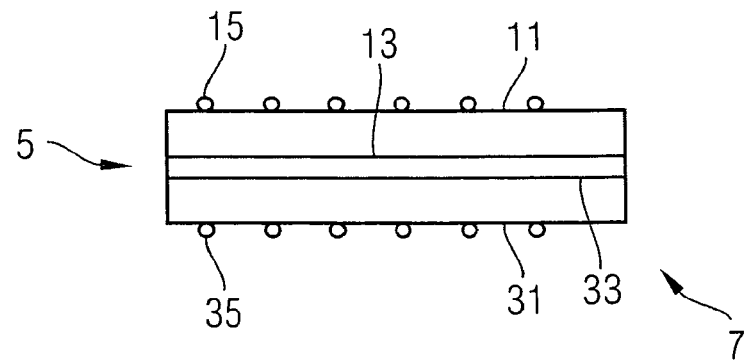

In a second step of the embodiment, the integrated circuits 1, 3 are adhered together by a layer 5 of adhesive, to give a composite body 7 having bumps 15, 35 on both sides. The adhered chips 1, 3 are shown in FIG. 1(c).

Figure 2:
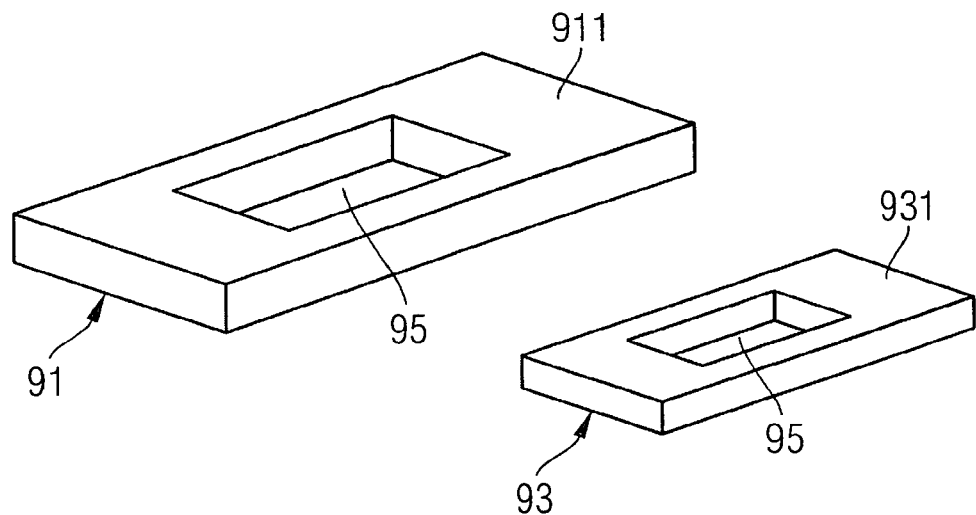
FIG. 2 shows two substrate elements for use in the method of FIG. 1.

The composite body 7 can then be embodied into a substrate 9, which is composed of two substrate elements 91, 93, shown in FIG. 2, which contain respective cavities 95. The substrate elements 91, 93 have respective surfaces 911, 931 which can be placed facing each other such that the cavities 95 together form a chamber 97 (shown in FIG. 3). The substrate 9 can be of any conventional type, such as a flex substrate, ALIVH (any layer interstitial via holes) substrate, ceramic substrate, lead frame substrate, etc. It may be a PCB (printed circuit board), with wiring printed on its major surfaces opposite the surfaces 911, 931.

Pick and place equipment is used to arrange the composite body 7 and substrates 91, 93 with the substrate elements 91, 93 sandwiching the composite body. The composite body 7 is located in the chamber 97 formed by the two cavities 95. The completed package 2 is shown in cross-section in FIG. 3.

The substrate 9 contains electric contacts 92, which are in register with the contacts 15, 35 of the composite body 7, so that electrical connections are formed between corresponding contacts when the composite body 7 is placed into the chamber 97. As in known flip-chip technology, an interconnect material can be used between the respective contacts, such as an ACF or ACP (anisotropic conductive film or paste), an ICP (isotropic conductive paste), NCF or NCP (non-conductive film or non-conductive paste), and/or an adhesive. The MSL (moisture sensitivity level) performance of the package 2 may only depend on the substrate material, and not on under-fill or mold compound properties.

One or both of the substrate elements 91, 93 may contain electrical connections (not shown) that extend transverse to the surfaces 11, 13, 31, 33 and/or connections 94, which extend parallel to the surfaces 11, 13, 31, 33. Furthermore, components (such as passive components) may be provided within one or both of the substrate elements 91, 93. For example, these may be printed on the surfaces 911, 931 before they are placed together.

Optionally, the substrate elements may include apertures 98 for receiving a resin material 99 (such as an epoxy material). The apertures 98 are in communication with the chamber 97, and the resin material is injected into the chamber 97 after the substrate elements 91, 93 have been joined together sandwiching the composite body 7 in the chamber 97.

Additional electronic components 22 (which can comprise active and/or passive components) can be provided on the outer major surfaces 24 of the package 2, as in conventional techniques. These components 22 are electrically connected to each other as in conventional techniques (e.g., if the outer surfaces 24 of the substrate 9 are equivalent to a conventional PCB), may be connected to the electrical contacts 15, 35 on the composite body 7 by the connections that extend transverse to the outer surfaces 24 of the package 2. The components 22 may be provided as close to each other as the components conventionally mounted on the surfaces of a PCB.

The electrical connections to and between the integrated circuits 1, 3 (especially the connections extending transverse to the surfaces 24) may be significantly shorter than the connections in conventional packaging techniques, and this reduced routing path leads to more robust signals, having less signal distortion at high operating frequency.

Many variations of the first embodiment are possible within the scope of the invention.

Figure 4:
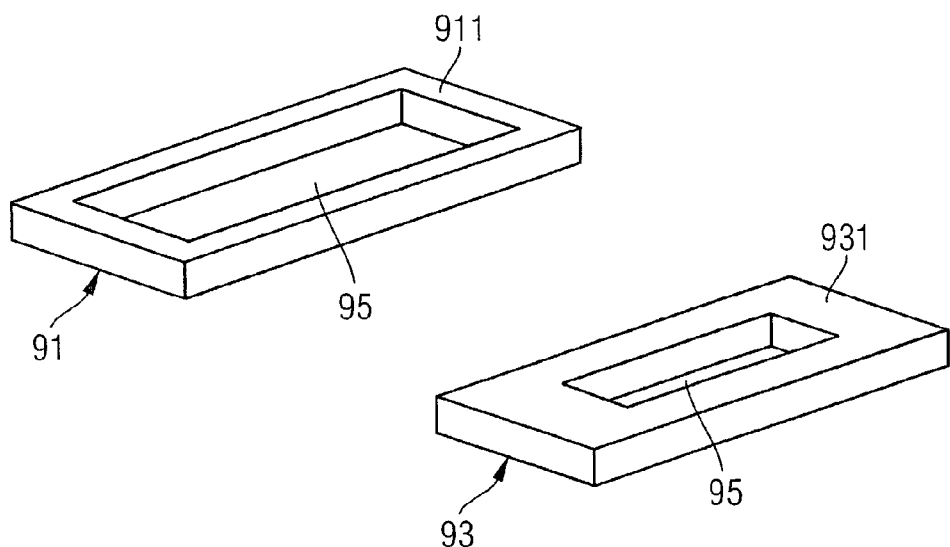
FIG. 4 shows two substrate elements that may be used in a variation of the first embodiment.

For example, although the integrated circuits 1, 3 have the same areas (i.e., the rectangular surfaces 11, 13, 31, 33 each have the same length and each have the same width), the invention is not limited in this respect. For dies of different areas, it may be preferable to form the cavity to be in a shape other than a cuboid. For example, the respective cavities 95 in the substrate elements 91, 93 may be of different sizes to receive respective integrated circuits of different areas, as shown in FIG. 4.

Additionally, although the embodiment shown uses two substrate elements 91, 93, the invention is not limited in this respect, and the substrate may include any number of layers that may be combined together to form a substrate having a chamber. Electronic components, such as passive components, may be provided on any of the surfaces of any of these layers.

In a further variation, the two integrated circuits 1, 3 need not be formed into a composite body before being located in the chamber. Rather, they may be located there in separate steps carried out by the pick and place equipment. Optionally, they may be adhered by being inserted into the chamber 97.

Figure 5:
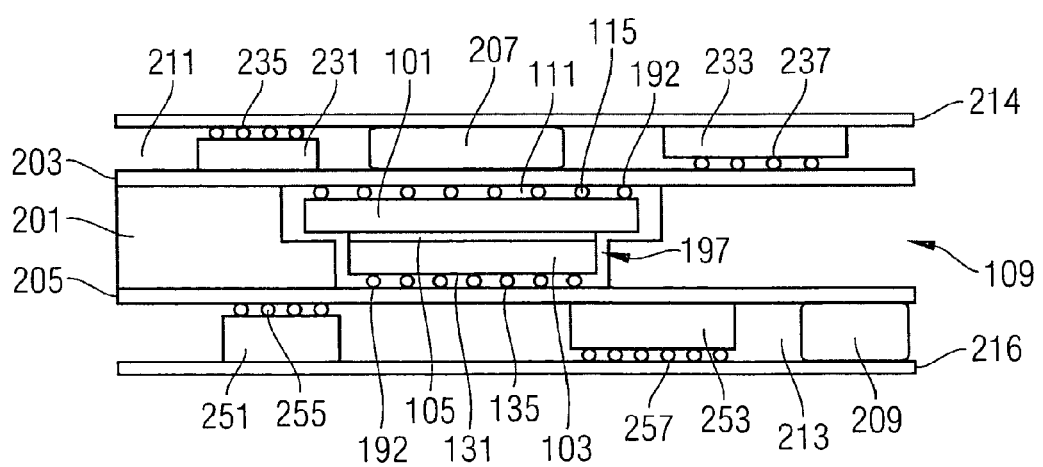
FIG. 5 shows in cross-section a second embodiment of the invention.

Turning to FIG. 5, a second embodiment of the invention is shown. In this embodiment elements corresponding to those of the first embodiment are shown by reference numerals 100 higher. Elements of the second embodiment that do not correspond exactly to elements of the first embodiment are indicated by reference numerals starting with "2".

The second embodiment includes two integrated circuits 101, 103 adhered together by an adhesive layer 105. The integrated circuits 101, 103 have major surfaces 111, 131, which include electronic components. The opposite surfaces of the integrated circuits have been ground down as described above, and are adhered together by the layer 105. The integrated circuits 101, 103 are of different areas, though they may have substantially the same thickness. The integrated circuits 101, 103 are located within a chamber 197, which is formed as a cavity in a primary substrate element 201. The upper and lower openings of the cavity are closed by secondary substrate elements 203, 205, which are thin layers, containing electronic routing circuitry. Electric contacts 192 of this circuitry contact respective electric contacts 115, 153 of the integrated circuits 101, 103. The chamber 197 may optionally be filled with a resin material, which is injected and then cured.

The package may further include additional integrated circuits 231, 233, 251, 253 located on the outer sides of the secondary substrate elements 203, 205, and tertiary substrate elements 214, 216 covering the additional integrated circuits 231, 233, 251, 253. The additional integrated circuits 231, 233, 251, 253, like the integrated circuits 101, 103 have a first major face containing electrical circuitry and electrical contacts 235, 237, 255, 257, and a second major face, which has been ground down. Any of the additional integrated circuits 231, 233, 251, 253 may have their electrical contacts facing the corresponding secondary substrate elements 203, 205, or facing the corresponding tertiary substrate elements 214, 216.

The spaces 211, 213 between the secondary substrate elements 203, 205 and the tertiary substrate elements 214, 216 may be filled with a resin material (such as an underfill layer), which is injected and then cured. Optionally, spacer elements 207, 209 may be provided in the spaces 211, 213 to increase mechanical stability and/or to reduce the amount of resin material required.

Figure 3:
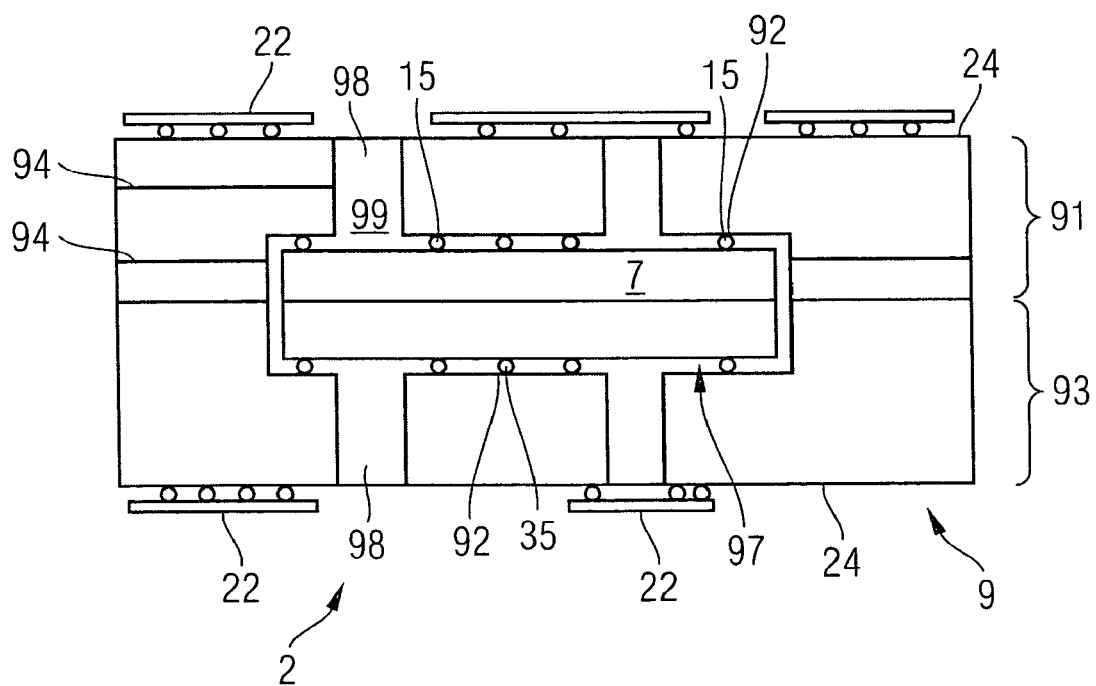
FIG. 3 shows a package that is a result of the method of FIG. 1.

The outer faces of the tertiary substrate elements 214, 216 constitute outer surfaces of the package, and are available for electronic components, corresponding to the components 22 of FIG. 3, to be located on them.

In variations of the second embodiment, the structure of FIG. 5 can be built up on one or both sides, by adding on one or both sides additional integrated circuits and additional tertiary substrate elements covering the additional integrated circuits. This process can be carried out as often as desired.

What is claimed is:

1. An integrated circuit package comprising:
a substrate defining a chamber and having no light-transparent cover;
a first integrated circuit located within the chamber, the first integrated circuit having circuitry on a first major surface;
a second integrated circuit located within the chamber such that second major surfaces of the first and second integrated circuits face one another, the second integrated circuit having circuitry on a first major surface, the second integrated circuit adhered together with the first integrated circuit to form a composite body; and
electrical connections between bump electric contacts of the first integrated circuit and electrical contacts of the substrate, and between bump electric contacts of the second integrated circuit and electrical contacts of the substrate.

2. The package according to claim 1, wherein the chamber has at least one wall that includes contact points that are in register with electric contacts of the first integrated circuit, the substrate further including leads extending from the contact points through the substrate.

3. The package according to claim 1, further comprising an electrically conductive layer disposed between the first and second integrated circuits, the electrically conductive layer extending over at least a part of an interface between the first and second integrated circuits.

4. The package according to claim 1, wherein the substrate comprises at least two substrate elements that each include at least one cavity, and wherein the substrate elements are located with the cavities in register thereby forming the chamber.

5. The package according to claim 4, at least one of the substrate elements comprises a printed circuit board.

6. The package according to claim 1, wherein the substrate comprises:
a primary substrate element that includes at least one cavity having at least one opening; and
one or more secondary substrate elements that extend over the at least one opening.

7. The package according to claim 6, wherein the one or more secondary substrate elements include electrical circuitry.

8. The package according to claim 1, further including one or more additional integrated circuits that are covered by one or more tertiary substrate elements.

9. The package according to claim 1, further comprising one or more electronic components electrically connected to the package and mounted on an outer surface of the package.

10. A circuit comprising:
a plurality of substrate sections having no light-transparent cover;
a chamber defined within at least one of the plurality of substrate sections;
a first integrated circuit comprising a first major surface and a second major surface opposite the first major surface, the first major surface of the first integrated circuit comprising circuitry and bump bonding pads; and a second integrated circuit comprising a first major surface and a second major surface opposite the first major surface, the first major surface of the second integrated comprising circuitry and bump bonding pads, wherein the first integrated circuit and the second integrated circuit are adhered together to form a composite body such that the second major surfaces of the first and second integrated circuits face each other, the composite body is disposed within the chamber, the bump bonding pads of the first integrated circuit are bump bonded to electrical contacts on a surface of one of the plurality of substrate sections, and the bump bonding pads of the second integrated circuit are bump bonded to electrical contacts on a surface of another one of the plurality of substrate sections.

11. The circuit of claim 10, wherein the first integrated circuit and the second integrated circuit are adhered together with an adhesive.

12. The circuit of claim 10, further comprising resin material surrounding the first and second integrated circuits within the chamber.

13. The circuit of claim 12, wherein the chamber further comprises an aperture through which the resin material is injected.

14. The circuit of claim 10, wherein:

the plurality of substrate sections comprise at least two substrate sections that each include at least one cavity; and the chamber comprises at least one cavity of the at least two substrate sections.

15. The circuit of claim 14, wherein:

the first and second integrated circuits each comprise a different area; and at least one cavity in one of the at least two substrate section comprises an area different from an area of at least one cavity in another one of the at least two substrate sections.

16. The circuit of claim 10, wherein the second major surfaces of the first integrated circuit and the second integrated circuit have been ground down to less than a thickness of the chamber.

17. The circuit of claim 10, further comprising an additional electronic component coupled to an outside surface of at least one of the plurality of substrate sections.

18. The circuit of claim 17, wherein the additional electronic component comprises a third integrated circuit.

19. The circuit of claim 10, further comprising an additional electrical component coupled to an inside surface of at least one of the plurality of substrate sections.

20. The circuit of claim 10, further comprising a further additional electrical components coupled to inside and outside surfaces of some of the plurality substrate sections.

21. The package according to claim 1, wherein the substrate comprises a resin-filled aperture.

22. The package according to claim 1, wherein the substrate comprises a printed circuit board (PCB) substrate.

23. The circuit of claim 10, wherein at least one of the plurality of substrate sections comprises a resin-filled aperture.

24. The circuit of claim 10, wherein the substrate comprises a printed circuit board (PCB) substrate.

* * * * *